United States Patent [19]

Naniwae et al.

[11] Patent Number: 5,834,361
[45] Date of Patent: Nov. 10, 1998

[54] MULTI-LAYER STRUCTURE FOR II-VI GROUP COMPOUND SEMICONDUCTOR ON AN INP SUBSTRATE AND METHOD FOR FORMING THE SAME

[75] Inventors: Kouichi Naniwae; Toru Suzuki, both of Tokyo, Japan

[73] Assignee: NEC Corporation, Tokyo, Japan

[21] Appl. No.: 630,126

[22] Filed: Apr. 10, 1996

[30] Foreign Application Priority Data

Apr. 17, 1995 [JP] Japan ..................................... 7-115067

[51] Int. Cl.$^6$ .......................... H01L 21/363; H01L 29/22
[52] U.S. Cl. ........................ 438/423; 148/33.4; 148/33.5; 148/DIG. 64; 148/DIG. 169; 257/12; 257/78; 438/509
[58] Field of Search .......................... 148/33, 33.3, 33.4, 148/DIG. 64, DIG. 169, 33.5; 437/126, 129, 133, 105, 107; 257/12, 78

[56] References Cited

U.S. PATENT DOCUMENTS

| | | | |
|---|---|---|---|
| 5,254,496 | 10/1993 | Briggs et al. | 437/133 |
| 5,273,933 | 12/1993 | Hatano et al. | 437/133 |
| 5,284,783 | 2/1994 | Ishikawa et al. | 437/126 |
| 5,372,970 | 12/1994 | Kubo | 437/105 |

FOREIGN PATENT DOCUMENTS

| | | |
|---|---|---|
| 62-84581 | 4/1987 | Japan . |
| 3-244117 | 10/1991 | Japan . |

OTHER PUBLICATIONS

S. Saito et al., Jpn. J. Appl. Phys. 33(5B)(1994)L705 "Surface preparation . . . MBE growth of ZnSe layers on InGaP layers", May 1994.

N. Dai et al., Appl. Phys. Lett. 66(20)(1995)2742 "MBE . . . .ZnCdSe on InP substrates", May 1995.

D. Rioux et al., J. Electron Spectroscopy & Related Phenom. 68(1994)719 "Photoemission . . . barrier in ZnSe / InP (100) heterostructures", May 1994.

K. Lu et al., J. Cryst. Growth, 138(1994) 1 "(In,Ga)P buffer layers for ZnSe . . . ", 1994.

Y. Hishida et al., J. Cryst. Growth, 150(1995)828 "Reduction of p–ZnSe / p–GaAs . . . GaN buffer layer", 1995.

T. Morita et al.; "Molecular Beam Epitaxial Growth of MgZnCdSe on (100) InP Substrates"; Seventh International Conference on Indium Phosphide and Related Materials p. 805, 1995.

N. Kobayashi et al.; "As and P Desorption from III–V Semiconductor Surface in Metalorganic Chemical Vapor Deposition Studied by Surface Photo–Absorption"; Japanese Journal of Applied Physics, Vo. 30, No. 10A, Oct. 1991, (1991), pp. L1699–L1701.

J.W. Matthews et al.; "Defects in Epitaxial Multilayers"; Journal of Crystal Growth, vol. 27 (1974), pp. 118–125.

*Primary Examiner*—Charles L. Bowers, Jr.
*Assistant Examiner*—Leon Radomsky
*Attorney, Agent, or Firm*—Whitham, Curtis, Whitham & McGinn

[57] ABSTRACT

In a method of forming a II-VI compound semiconductor thin film on an InP substrate, a layer of III-V compound semiconductor mixed crystal is first formed on the InP substrate. The desorption rate of a group V element constituting the III-V compound semiconductor mixed crystal at a decomposition temperature of a native oxide layer formed on a surface of the III-V compound semiconductor mixed crystal layer is lower than a desorption rate of P of the InP substrate at a decomposition temperature of a native oxide layer formed on a surface of the InP substrate. A II-VI compound semiconductor thin film layer is formed on the first III-V compound semiconductor mixed crystal layer.

12 Claims, 5 Drawing Sheets

MULTI-LAYER STRUCTURE FOR II-VI GROUP COMPOUND SEMICONDUCTOR ON AN INP SUBSTRATE AND METHOD FOR FORMING THE SAME

BACKGROUND OF THE INVENTION

1. Field of the Invention

The present invention relates to a multi-layer structure for a II-VI compound semiconductor thin film and a method of forming the same.

2. Description of Related Art

Semiconductor lasers for wavelengths from an infrared region to a red region and light emitting diodes for wavelengths from the infrared region to an olive region are realized using a III-V compound semiconductor composed of the group III element such as Al, Ga, and In and the group V element such as As, P and Sb. In order to realize light emitting devices with a shorter wavelength than such wavelengths, a semiconductor having a wider energy band gap is required. However, it is difficult to achieve the wider energy band gap in the III-V compound semiconductor as mentioned above.

On the other hand, II-VI compound semiconductor composed of a group II element such as Zn, Cd, and Te and a group VI element such as S, Se and Te have a relatively wide energy band gap to emit light over the visible spectral region. For this reason, the II-VI group compound semiconductors are expected as the material for light emitting devices from green to ultraviolet spectral region and have been investigated intensively.

Since it is difficult to obtain II-VI bulk crystals with good quality, a III-V bulk crystal which is commercially valuable with a high quality is usually used as a substrate to fabricate a II-VI compound semiconductor film. The lattice constant of GaAs is close to that of ZnSe which is one of basic alloy in II-VI compound semiconductor so that GaAs is most generally used in III-V bulk crystal as a substrate to grow the II-VI compound semiconductor thin film. However, by using InP as the substrate material, II-VI compounds which are a different composition from that of the II-VI film grown on the GaAs substrate under the lattice-matching condition can be grown and is used in many application fields.

FIG. 1 is a layer structure of a conventional II-VI compound semiconductor film manufactured on an InP substrate by a molecule beam epitaxy (MBE) method. In a case where the II-VI compound semiconductor is manufactured on the InP substrate 1, it is necessary to remove a native oxide layer on the surface of the InP substrate 1. Usually, in a case where a III-V compound semiconductor thin film is formed on the InP substrate 1, the removal of the native oxide layer is performed while irradiating a beam of group V atoms such as P or As, so that desorption of P from the InP substrate 1 is prevented. However, in case of II-VI compound growth, because group V element such as P and As acts as impurity. For this reason, in order to remove the native oxide layer from the substrate while irradiating the beam of group V atoms, it is necessary to provide a III-V compound semiconductor growth chamber connected to a II-VI compound semiconductor growth chamber via a vacuum carrying mechanism or a new dedicated chamber for irradiating a beam of group V atoms. As a result, the MBE apparatus becomes very complicated and expensive so that the manufacturing cost of a device is increased.

In case of an MBE apparatus with no III-V element compound semiconductor growth chamber or no chamber for irradiating the beam of group V atoms, the InP substrate 1 is heated up, without irradiating the beam of V group atoms, to 480° C. at which the native oxide layer on the InP substrate surface is decomposed and vapored. Then, after it is ensured by means of the in-situ monitoring such as a reflection high energy electron diffraction that the native oxide layer is removed and 2×4 surface reconstruction appears, the substrate temperature is immediately decreased to minimize the desorption of P atoms. Many In metal droplets are observed on the InP substrate surface from which the native oxide layer is removed by the above method. This is because P atoms in InP substrate violently desorbs from the substrate surface in addition to the decomposition and vaporing of the native oxide layer if the InP substrate 1 is heated to 480° C. without irradiating the beam of group V atoms. If a ZnCdSe thin film which is one of II-VI compound semiconductor films is formed on the InP substrate having droplets, the ZnCdSe cannot be correctly grown on the In droplet portions. FIG. 2 is a diagram showing a surface morphology of the ZnCdSe thin film having 0.6 μm thickness which is formed on the InP substrate 1 in this manner. The photograph was taken with a Normarski phase contrast microscope. White portions indicate defective portions where abnormal growth is caused due to In droplets. Pits are formed at the white portions. The thin film having the many pits cannot be applied to a device.

SUMMARY OF THE INVENTION

The present invention has, as an object, to provide a multi-layer structure for a II-VI compound semiconductor thin film and a method of forming the same.

In order to achieve an aspect of the present invention, a method of forming a II-VI compound semiconductor thin film, includes the steps of:

providing an InP substrate;

forming a layer of III-V compound semiconductor mixed crystal on the InP substrate, wherein a desorption rate of a group V element constituting the III-V compound semiconductor mixed crystal at a decomposition temperature of a native oxide layer formed on a surface of the III-V compound semiconductor mixed crystal layer is lower than a desorption rate of P of the InP substrate at a decomposition temperature of a native oxide layer formed on a surface of the InP substrate; and forming a II-VI compound semiconductor thin film layer formed on the first III-V compound semiconductor mixed crystal layer.

In this case, the III-V compound semiconductor mixed crystal layer may be a layer of InGaAs mixed crystal layer having an arbitrary composition ratio. It is desirable that the layer of III-V group compound semiconductor mixed crystal layer has a thickness of a critical thickness or below and that it has a lattice matching to the InP substrate.

In order to achieve another aspect of the present invention, a multi-layer structure for a II-VI compound semiconductor thin film, includes an InP substrate, a first layer of III-V compound semiconductor mixed crystal formed on the InP substrate, wherein a desorption rate of a group V element constituting the III-V compound semiconductor mixed crystal at a decomposition temperature of a native oxide layer formed on a surface of the first layer is lower than a desorption rate of P of the InP substrate at a decomposition temperature of a native oxide layer formed on a surface of the InP substrate, and a second layer of II-VI compound semiconductor thin film formed on the first layer.

DESCRIPTION OF THE PREFERRED EMBODIMENTS

The multi-layer structure for a II-VI compound semiconductor thin film according to the present invention will be described with reference to accompanying drawings.

Figure 1:
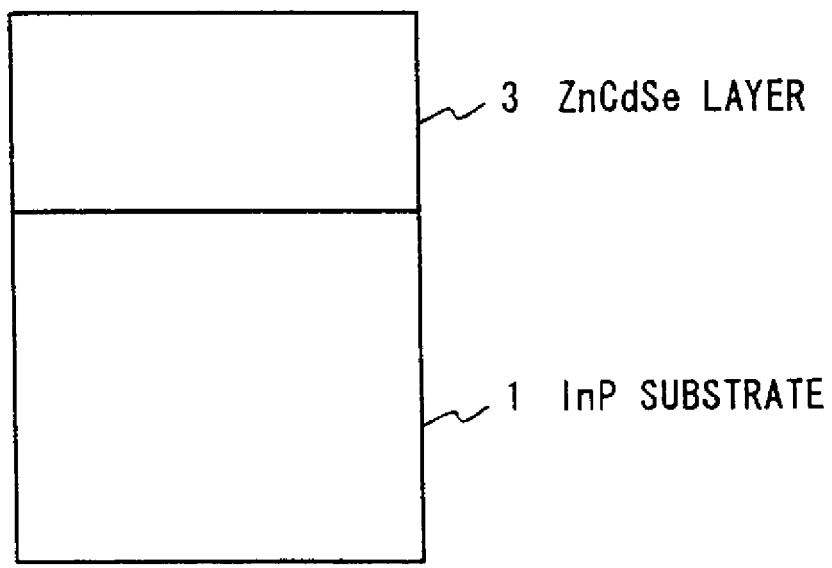
FIG. 1 is a cross sectional view of the layer structure for a conventional II-VI compound semiconductor film.
Figure 2:
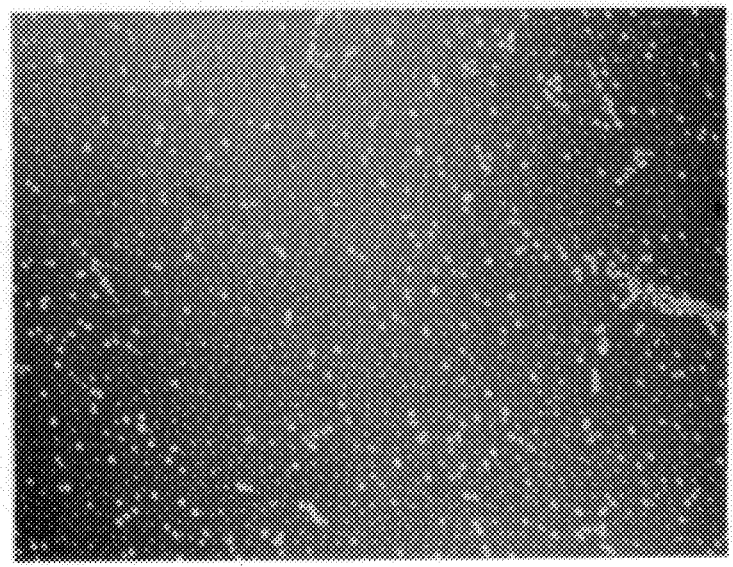
FIG. 2 is a diagram showing a surface morphology of ZnCdSe grown by a conventional method, wherein the morphology is obtained using a Normarski phase contrast microscope.
Figure 3:
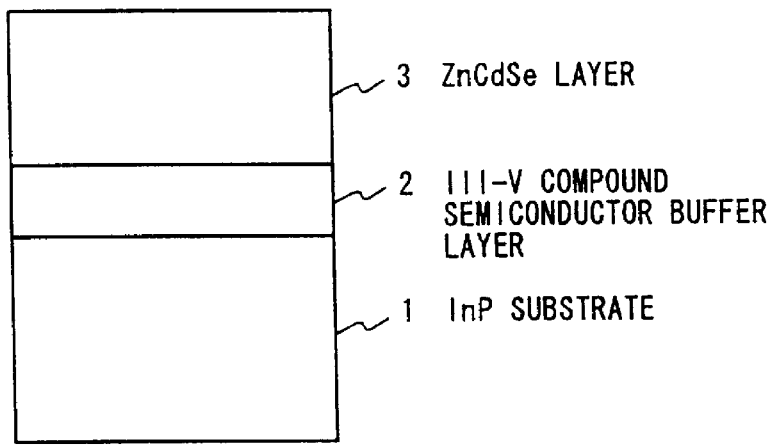
FIG. 3 is a cross sectional view of the layer structure for a II-VI group compound semiconductor film according to the present invention.

FIG. 3 is a cross sectional view of the layer structure of the multi-layer structure for a II-VI compound semiconductor thin film. Referring to FIG. 3, the InP substrate 1 is used on which a III-V group compound semiconductor mixed crystal buffer layer 2 is deposited. The desorption rate of the constituent group V element of the buffer layer 2 at the decomposition temperature of a native oxide layer of the buffer layer 2 is lower than that of P of the InP layer 1 at the decomposition temperature of a native oxide layer of the InP substrate 1. The InP substrate 1 with the buffer layer 2 is used as a substrate. Thereby, the native oxide layer of the substrate surface can be removed without generating droplets of the constituent III group element on the mixed crystal even if group V atom beam is not irradiated. If a ZnCdSe layer 3 lattice matching to InP is deposited on the mixed crystal buffer layer 2 whose native oxide layer is removed in the above manner, an extremely specular surface can be obtained without pits due to the droplets of the group III metal.

Figure 4:
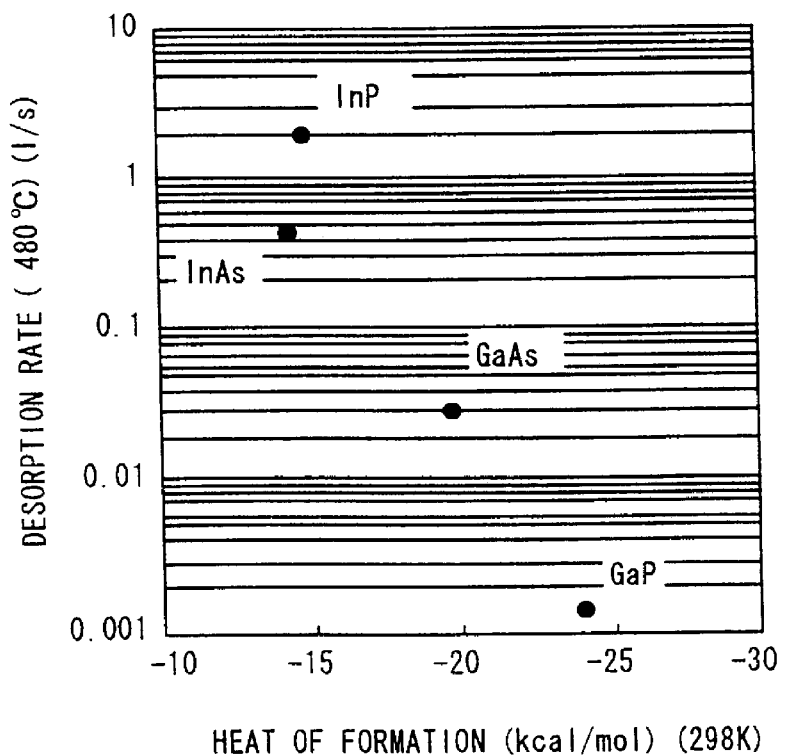
FIG. 4 is a diagram showing a relation between standard heat of formation of III-V binary mixed crystal and desorption rate of group V element at 480° C.

The desorption rate of the constituent V group element in the III-V group mixed crystal has a strong correlation to heat of formation of the mixed crystal (formation enthalpy) and if the standard heat of formation of the mixed crystal is examined, the desorption rate can be estimated. FIG. 4 shows the relation between the desorption rate of a group V element and the standard heat of formation at 480° C. obtained the experimental data of III-V binary mixed crystal shown in a reference (Jap. J. Appl. Phys. Vol. 30, No. 10A, p. L1699, 1991). As seen from the reference, GaAs and GaP which has greater heat of formation than InP and InAs has lower desorption rates of the constituent group V element than InP and InAs by one or two orders.

Therefore, when the III-V group compound semiconductor layer whose constituent group V element has a desorption rate lower than that of P from the InP substrate 1 at the decomposition temperature of a native oxide layer of the crystal surface is deposited before the II-VI group compound semiconductor thin film is deposited, the desorption of constituent group V element can be suppressed so that the group II-VI compound semiconductor thin film 3 with high quality can be obtained without generating group III metal droplets even if the beam of group V atoms is not irradiated. The above effect is not dependent upon the film thickness of the III-V mixed crystal layer. However, considering the film quality of the II-VI compound semiconductor thin film to be deposited on the mixed crystal layer, the film thickness of the III-V mixed crystal layer is desirably equal to or thinner than a critical thickness in which crystal defects are generated due to lattice mismatching. Furthermore, it is the most desirable that the III-V mixed crystal layer is lattice-matched to the substrate.

Figure 5:
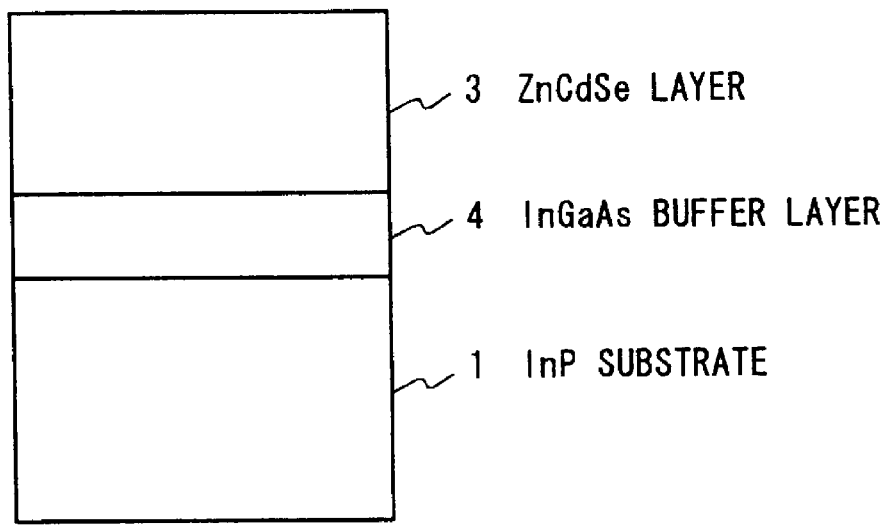
FIG. 5 is a cross sectional view of the layer structure for a II-VI compound semiconductor according to a first embodiment of the present invention.

FIG. 5 is a cross sectional view of the layer structure for the II-VI semiconductor thin film according to the first embodiment of the present invention. Referring to FIG. 5, in the embodiment, InGaAs is used as a material of the III-V compound semiconductor mixed crystal buffer layer 4. A substrate is used in which the buffer layer 2 of InGaAs with an arbitrary composition is deposited on the InP layer 1 to have the thickness of 0.1 $\mu$m. The native oxide layer on the surface of InGaAs buffer layer 2 thermally decomposes in a temperature range of 520° to 580° C. in a vacuum chamber. The desorption rate of As as the constituent V group element in the temperature range is sufficiently low compared to the desorption rate of P at 480° C. which is the decomposition temperature of the native oxide layer of InP. Therefore, the native oxide layer can be removed without generating group III metal droplets on the InGaAs even if the beam of group V atoms is not irradiated. When a layer 3 of ZnCdSe of 0.6 $\mu$m lattice matching to InP is deposited on the InGaAs buffer layer 4 from which the native oxide layer is removed as in the above-mentioned manner, an extremely specular surface can be obtained without pits due to the droplets of the group III metal. In the first embodiment, the InGaAs buffer layer 4 having the arbitrary composition is deposited to have the thickness of 0.1 $\mu$m. However, the thickness is not limited to 0.1 $\mu$m.

Next, the II-VI compound semiconductor thin film according to a modification of the first embodiment of the present invention will be described below.

In the modification, the film thickness of the InGaAs buffer layer 4 used in the first embodiment is set to a critical thickness or below such that any crystal defect is not generated due to lattice-mismatching to the InP substrate 1. In this embodiment, the lattice mismatching of 0.1% exists between the InP substrate 1 and InGaAs buffer layer 4 and the film thickness of the InGaAs buffer layer 4 is set to about 0.1 $\mu$m which is thinner than 0.15 $\mu$m as the critical thickness in this case. The critical thickness of the InGaAs buffer layer 4 changes depending upon the degrees of lattice-mismatching between the InP substrate 1 and the InGaAs buffer layer 4. It can be calculated on the basis of dynamical equilibrium theory discussed by Matthews and Blackeslee (J. Cryst. Growth, Vol. 27, p. 118, 1974).

Thereafter, the native oxide layer is removed from the InGaAs buffer layer 4 surface and then when the layer 3 of ZnCdSe lattice-matched to InP is deposited on the buffer layer 4, the high quality ZnCdSe film can be obtained with an extremely specular surface without pits due to droplets of the group III metal.

Figure 6:
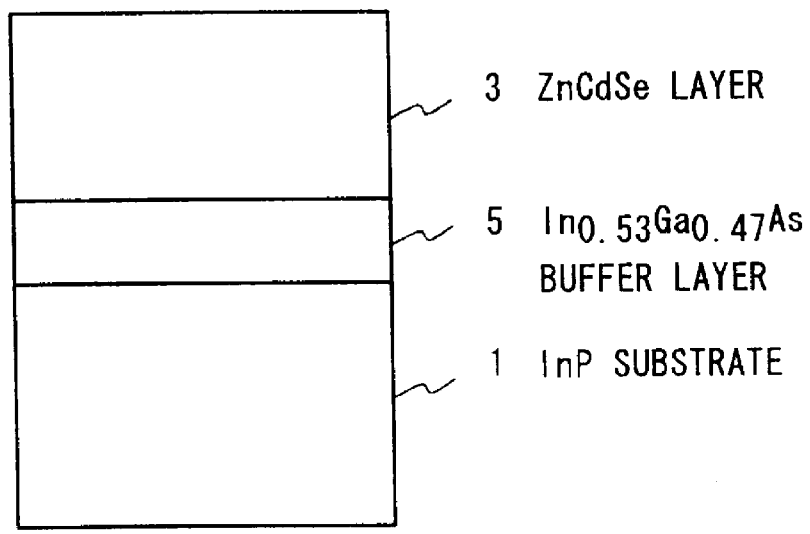
FIG. 6 is a cross sectional view of the layer structure for a II-VI compound semiconductor according to a second embodiment of the present invention.

Next, the II-VI compound semiconductor thin film according to the second embodiment of the present invention will be described. Referring to FIG. 6, if a layer of In$_{0.53}$Ga$_{0.47}$As lattice-matched to InP is deposited on the InP substrate 1 with the thickness of 0.3 $\mu$m, the native oxide layer on the InGaAs surface thermally decomposes at about 520° C. in a vacuum chamber. The desorption rate of As as the constituent group V element at that temperature is sufficiently low compared to that of P at the 480° C. which is the native oxide layer thermal decomposition temperature of InP. Therefore, the native oxide layer can be removed without generating droplets of the constituent group III element on the InGaAs even if the beam of group V atoms is not irradiated. Thereafter, when the layer 3 of ZnCdSe of 0.6 μm lattice-matched to InP is deposited on the $In_{0.53}Ga_{0.47}As$ layer from which the native oxide layer is removed, the ZnCdSe thin film with extremely high quality can be obtained to have an extremely specular surface without pits due to group III metal droplets. In the second embodiment the $In_{0.53}Ga_{0.47}As$ layer has the thickness of 0.3 μm. However, the thickness is not limited to this value.

Figure 7:
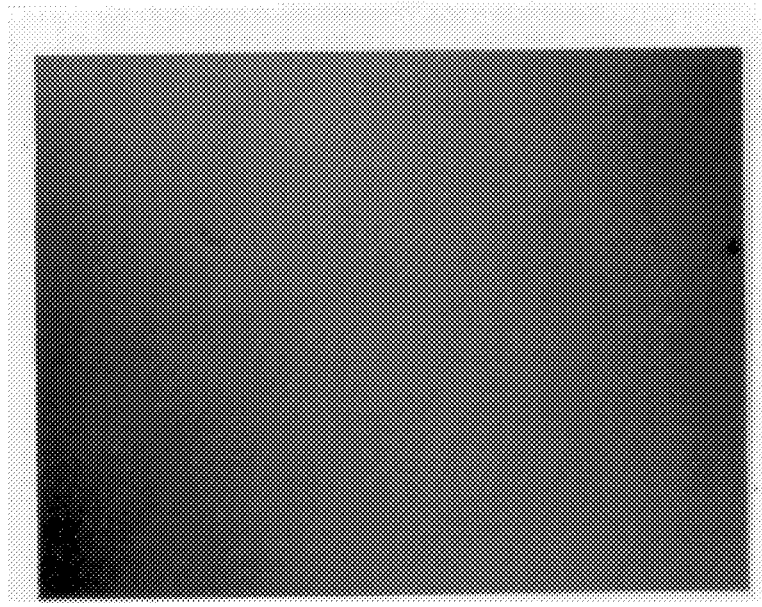
FIG. 7 is a diagram showing a surface morphology of ZnCdSe film grown with the layer structure according to the second embodiment of the present invention, wherein the morphology is obtained using a Normarski phase contract microscope.

FIG. 7 shows a surface morphology of ZnCdSe film obtained in the second embodiment. The photograph was taken with a Normarski phase contrast microscope. No defect due to droplets of the group III metal exists on the surface and the surface is extremely specular. Also, the ZnCdSe thin film has 50 times or above stronger photoluminescence at room temperature than a conventional ZnCdSe thin film grown directly on the InP substrate and having the same composition and same film thickness. Furthermore, a full width at half maximum of a double-crystal X-ray diffraction curve in the ZnCdSe thin film of the present invention is reduced to about 50 seconds which is one fourth or below compared to that in the conventional ZnCdSe thin film. In the above embodiment, the film thickness of ZnCdSe thin film is 0.6 μm. However, the film thickness is not limited to the value.

In the above-mentioned embodiments, the method of forming the ZnCdSe thin film on the InP substrate was described. However, the method can be applied to other II-VI compound semiconductor mixed crystal layer such as MgZnCdSe and MgZnSeTe. Further, the same effect can be obtained regardless of the conductive type and kind of dopant of the III-V buffer layer deposited on the InP substrate. In addition, even if the InGaAs buffer layer is replaced by an InGaAsP layer, the same effect can be obtained if an adequate composition ratio is selected such that the composition of InP is small.

As described above, according to the present invention, since the III-V compound semiconductor layer whose constituent group V element has a desorption rate lower than that of P of the InP layer 1 at the decomposition temperature of a native oxide layer of the crystal surface is deposited before the II-VI compound semiconductor thin film is deposited, it is made possible to form the II-VI compound semiconductor thin film with extremely high quality on the InP substrate without group III metal droplets even if the beam of group V atoms is not irradiated.

What is claimed is:

1. A multi-layer structure for a II-VI compound semiconductor thin film, comprising:
    an InP substrate;
    a first layer of III-V compound semiconductor mixed crystal formed on said InP substrate, and said first layer of a III-V compound semiconductor mixed crystal being devoid of InP, wherein a desorption rate of a group V element constituting said III-V compound semiconductor mixed crystal at a decomposition temperature of a native oxide layer formed on a surface of said first layer being lower than a desorption rate of P of said InP substrate at a decomposition temperature of a native oxide layer formed on a surface of said InP substrate, whereby said first layer preventing generation of liquid droplets of a group III element constituting said III-V compound semiconductor mixed crystal on said first layer during decomposition of said native oxide layer formed on said surface of said first layer; and
    a second layer of II-VI group compound semiconductor thin film formed on said first layer.

2. A multi-layer structure for II-VI compound semiconductor thin film according to claim 1, wherein said III-V compound semiconductor mixed crystal layer is InGaAs mixed crystal layer having an arbitrary composition ratio.

3. A multi-layer structure for II-VI compound semiconductor thin film according to claim 1, wherein said III-V compound semiconductor mixed crystal layer has a thickness of a critical thickness or less.

4. A multi-layer structure for II-VI compound semiconductor thin film according to claim 1, wherein said III-V compound semiconductor mixed crystal layer has a lattice matching to said InP substrate.

5. A multi-layer structure for II-VI group compound semiconductor thin film according to claim 2, wherein said III-V group compound semiconductor mixed crystal layer has a thickness of a critical thickness or less.

6. A multi-layer structure for II-VI compound semiconductor thin film according to claim 2, wherein said III-V compound semiconductor mixed crystal layer has a lattice matching to said InP substrate.

7. A method of forming a multi-layer structure for a II-VI compound semiconductor thin film, comprising the steps of:
    providing an InP substrate having a native oxide formed on a surface of said InP substrate;
    forming a first layer of III-V compound semiconductor mixed crystal devoid of InP on said InP substrate, wherein said first layer has a native oxide formed on surface of said first layer, wherein a desorption rate of a group V element constituting said III-V compound semiconductor mixed crystal at a decomposition temperature of said native oxide layer formed on said surface of said first layer being lower than a desorption rate of P of said InP substrate at a decomposition temperature of said native oxide layer formed on said surface of said InP substrate;
    thermally decomposing said native oxide layer formed on said first layer, whereby said first layer prevents generation of liquid droplets of a group III element constituting said III-V compound semiconductor mixed crystal on said first layer during said decomposing step; and
    forming a second layer of II-VI group compound semiconductor thin film on said first layer.

8. A method according to claim 7, wherein said step of forming said first layer of III-V compound semiconductor mixed crystal includes forming a InGaAs mixed crystal layer having an arbitrary composition ratio.

9. A method according to claim 7, wherein said first layer of III-V compound semiconductor mixed crystal has a thickness of a critical thickness or less.

10. A method according to claim 7, wherein said first layer of III-V compound semiconductor mixed crystal has a lattice constant matching to said InP substrate.

11. A method according to claim 8, wherein said first layer of III-V compound semiconductor mixed crystal has a thickness of a critical thickness or less.

12. A method according to claim 8, wherein said first layer of III-V compound semiconductor mixed crystal has a lattice constant matching to said InP substrate.

* * * * *